United States Patent [19]
Miyauchi

[11] Patent Number: 5,883,842
[45] Date of Patent: Mar. 16, 1999

[54] MEMORY CARD HAVING BLOCK ERASURE TYPE MEMORY UNITS WHICH ARE USED EVEN WHEN PARTIALLY DEFECTIVE

[75] Inventor: Shigenori Miyauchi, Tokyo, Japan

[73] Assignee: Mitsubishi Denki Kabushiki Kaisha, Tokyo, Japan

[21] Appl. No.: 732,818

[22] Filed: Oct. 15, 1996

[30] Foreign Application Priority Data

Apr. 11, 1996 [JP] Japan .................................. 8-089505

[51] Int. Cl.⁶ .................................................. G11C 29/00
[52] U.S. Cl. ............................ 365/200; 365/218; 235/492; 371/10.2
[58] Field of Search ............................... 365/200, 230.06, 365/218; 371/10.1, 10.2, 10.3; 711/103, 115, 202; 235/492

[56] References Cited

U.S. PATENT DOCUMENTS 5,524,231  6/1996  Brown ...................................... 711/101
5,691,945  11/1997  Liou et al. ................................ 365/200

*Primary Examiner*—Jack A. Lane

[57] ABSTRACT

A memory card with block erasure-type nonvolatile memory units is connected to a host apparatus by an I/O interface. The memory includes a plurality of block-erasure type nonvolatile memory units, a control circuit for inputting/outputting data to the host apparatus and managing nonvolatile memory units and address data to the memory, and a programmable logic device which converts address data to select respective erasure blocks of nonvolatile memories in accordance with a program. The control circuit programs the programmable logic device so that the address data for selecting defective erasure blocks is converted to address data for selecting other usable erasure blocks.

10 Claims, 5 Drawing Sheets

MEMORY CARD HAVING BLOCK ERASURE TYPE MEMORY UNITS WHICH ARE USED EVEN WHEN PARTIALLY DEFECTIVE

BACKGROUND OF THE INVENTION

1. Field of the Invention

The present invention relates to a memory card with nonvolatile memories of a block erasure type on board.

2. Description of the Prior Art

FIG. 6 is a block diagram schematically showing an example of a conventional memory card mounting flash memories which are nonvolatile memories of a block erasure type.

In FIG. 6, a memory card 50 consists of an interface circuit 51, an internal control CPU 52, a buffer memory 53 for inputting/outputting of data, a flash memory control circuit 54 and a memory part 55 composed of flash memories. The internal control CPU 52 is connected to the interface circuit 51 and the buffer memory 53, and also connected to the memory part 55 via the flash memory control circuit 54. When the memory card 50 of the constitution is connected to a host system apparatus 60 formed of a data processor, the host system apparatus 60 is brought into a connected state with the internal control CPU 52 via the interface circuit 51.

In the above state, the interface circuit 51 inputs/outputs data to the host system apparatus 60. The internal control CPU 52 controls signals in the memory card 50, and the flash memory control circuit 54 controls the memory part 55 in accordance with control data such as read/write commands, address data, etc. sent from the internal control CPU 52 to the memory part 55. For example, when the number of a sector is input from the internal control CPU 52, the flash memory control circuit 54 generates address data for the memory part 55 corresponding to the input sector number and outputs the data to the memory part 55.

Each flash memory as a component of the memory part 55 is electrically erasable memory, erasing data every erasure block of several K bytes to several tens of K bytes at a time. Data cannot be overwritten on the same address in the flash memory. While the flash memory of the memory part 55 is capable of writing or reading data only every 8 bits or 16 bits, the memory part 55 is required to send/receive data every 512 bytes to the host system apparatus 60, and therefore the buffer memory 53 is used as a cache memory between the internal control CPU 52 and memory part 55.

In general, there are several to several tens of flash memories mounted as an IC memory in the memory part 55 and, each flash memory has a plurality of erasure blocks. FIG. 7 is a diagram of an example of a memory map in the flash memories constituting the memory part 55 of FIG. 6. In FIG. 7, addresses of two flash memories 70, 71 each having a data width of 8 bits and erasure blocks of 64 KB each are connected parallel to each other, thereby attaining the data width of 16 bits. Respective 8 erasure blocks A-H are made to correspond each other in the flash memories 70, 71.

In the constitution of FIG. 7, even a single defective erasure block in the flash memory 70 or 71 generates an area not accessible from the host system apparatus in the memory space, whereby not a single byte of the partially defective flash memory is useful. The flash memories 70, 71 should accordingly be completely non-defective, and defective flash memories have been conventionally discarded, which leads to an increase of costs of the memory card.

Although it has been arranged in certain memory cards to use perfect erasure blocks alone with prohibiting the use of defective erasure blocks, when a plurality of flash memories are used in the manner as illustrated in FIG. 7 and if an erasure block A of the flash memory 70 is defective as well as an erasure block B of the flash memory 71, both erasures blocks A and B in each of the flash memories 70 and 71 become unusable. In other words, the erasure block of one flash memory corresponding to the defective erasure block of the other flash memory becomes unusable although it is not defective. The memories have been thus used inefficiently in the conventional memory card.

SUMMARY OF THE INVENTION

The object of the present invention is therefore to provide a memory card which is adapted to use even partly defective block erasure type nonvolatile memories efficiently, with eliminating the aforementioned problems.

In order to achieve the aforementioned objective, a memory card using block erasure type nonvolatile memories employed in a host apparatus formed of a data processor is provided. The memory card includes an interface part for connection with the host apparatus, a memory part including a plurality of nonvolatile memories of the block erasure type, a control part for inputting/outputting data to the host apparatus via the interface part and managing memories and address data for the memory part, and an address conversion part which converts address data output from the control part for the selection of respective erasure blocks in the nonvolatile memories of the memory part in accordance with a program, wherein the control part programs the address conversion part, whereby the address data for the selection of predetermined erasure blocks are converted to address data for selecting the other erasure blocks.

Specifically, the control part of the memory card specifies unusable erasure blocks in the memory part and programs the address conversion part so that the address data for the selection of unusable erasure blocks is converted to address data for selecting usable erasure blocks. When addresses are shared among a plurality of nonvolatile memories in the memory part, the control part programs the address conversion part to combine usable erasure blocks in respective nonvolatile memories in a manner to obtain the maximum memory capacity. For this purpose, the control part obtains a preliminarily registered, predetermined command from the host apparatus, and writes/reads data to the memory part in accordance with the command, thereby specifying unusable erasure blocks in the memory part.

The address conversion part retains and stores programmed contents by the control part even if the power supply to the memory card is shut off. More specifically, the address conversion part is formed of a nonvolatile PLD or comprises a volatile PLD and a storing part composed of nonvolatile memories. The storing part stores the program, and the volatile PLD reads out the program from the storing part every time the power supply to the memory card is started, thereby converting/setting address data.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
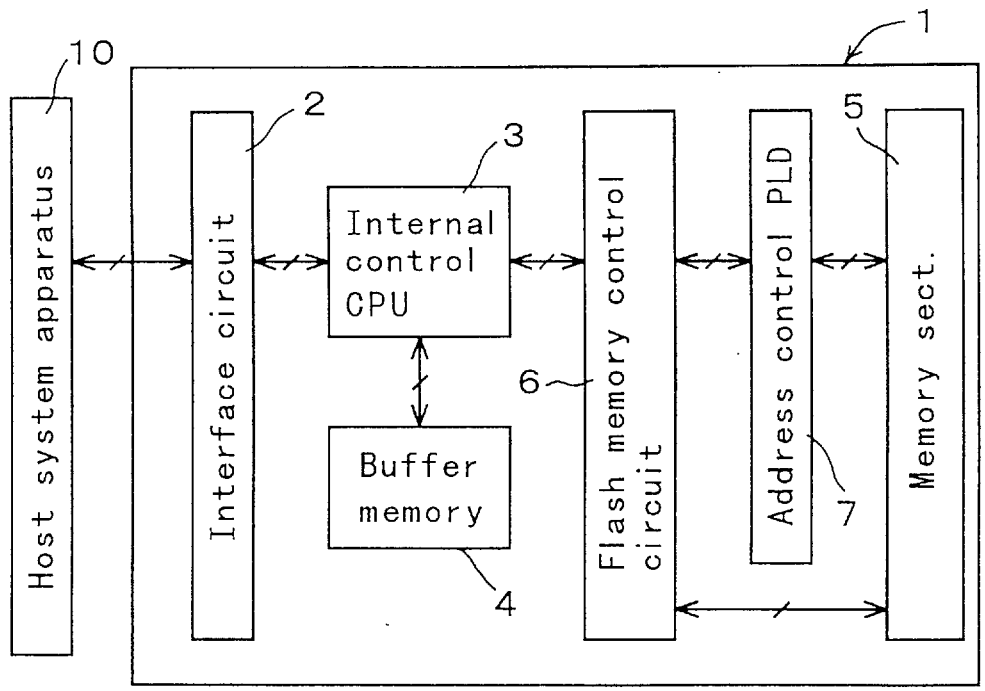
FIG. 1 is a block diagram schematically showing an example of a memory card in an embodiment 1 of the present invention.

The present invention will be described in detail in conjunction with preferred embodiments thereof shown in the drawings. In the following description of the present invention, a flash memory is exemplified as a nonvolatile memory of a block erasure type.

Embodiment 1

FIG. 1 is a block diagram schematically showing the constitution of an example of a memory card according to an embodiment 1 of the present invention.

In FIG. 1, a memory card 1 consists of an interface circuit 2 for inputting/outputting data from or to an externally connected data processor, an internal control CPU 3 for controlling signals in the memory card 1, a buffer memory 4 for inputting/outputting of data, a memory part 5 composed of flash memories, a flash memory control circuit 6 for controlling the memory part 5 in accordance with control data from the internal control CPU 3, and an address control PL part 7 which is a PLD (programmable logic device).

The interface circuit 2 is connected to the internal control CPU 3 which is in turn connected to the buffer memory 4 and also to the memory part 5 via the flash memory control circuit 6. At the same time, the flash memory control circuit 6 is connected to the memory part 5 via the address control PL part 7. When the memory card 1 constituted as above is connected to a host system apparatus 10 formed of a data processor, the host system apparatus 10 is connected to the internal control CPU 3 via the interface circuit 2 constituting an interface part. Similarly, the internal control CPU 3 and flash memory control circuit 6 constitute a control part and, the address control PL part 7 constitutes an address conversion part. The host system apparatus 10 is a host equipment.

Each of flash memories constituting the above memory part 5 is an electrically erasable nonvolatile memory, erasing data every block of several K bytes to several tens of K bytes at one time, wherein data cannot be overwritten at the same address. In other words, the erasure block is the minimum unit erasable at one time by the flash memory. In the case of a 16M-bit flash memory having erasure blocks of 64K bytes each, there are 32 erasure blocks formed in the flash memory. While the flash memory of the memory part 5 can write/read data nearly every 8 bits or 16 bits, it is necessary for the memory part to deliver data every 512 bytes to the host system apparatus 10. Therefore, the buffer memory 4 is used as a cache memory between the internal control CPU 3 and memory part 5.

The flash memory control circuit 6 controls the memory part 5 in accordance with control data such as a read/write command, address data, etc. sent from the internal control CPU 3 to the memory part 5. Data for the selection of erasure blocks within the address data are input to the memory part 5 from the flash memory control circuit 6 via the address control PL part 7, and the remaining data in the address data is directly input to the memory part 5 from the flash memory control circuit 6.

For instance, when the number of a sector is input from the internal control CPU 3, the flash memory control circuit 6 generates address data for the memory part 5 corresponding to the input sector number, and outputs data for selecting the erasure block among the generated address data to the memory part 5 via the address control PL part 7, with outputting the other data of the generated address data directly to the memory part 5. Moreover, the flash memory control circuit 6 directly outputs data to be stored in the memory part 5 and control signals such as output enable signals, chip select signals, etc. to the memory part 5.

When the memory card 1 is used for the first time, the internal control CPU 3, after obtaining from the host system apparatus 10 a capacity confirmation command to confirm the capacity registered beforehand, executes reading/writing to the memory part 5 to specify erasure blocks with failure areas. The internal control CPU 3 prohibits the specified erasure blocks from being used and programs the address control PL part 7 so that a count of utilizable erasure blocks becomes maximum. The address control PL part 7 is formed of a nonvolatile PLD.

Figure 2:
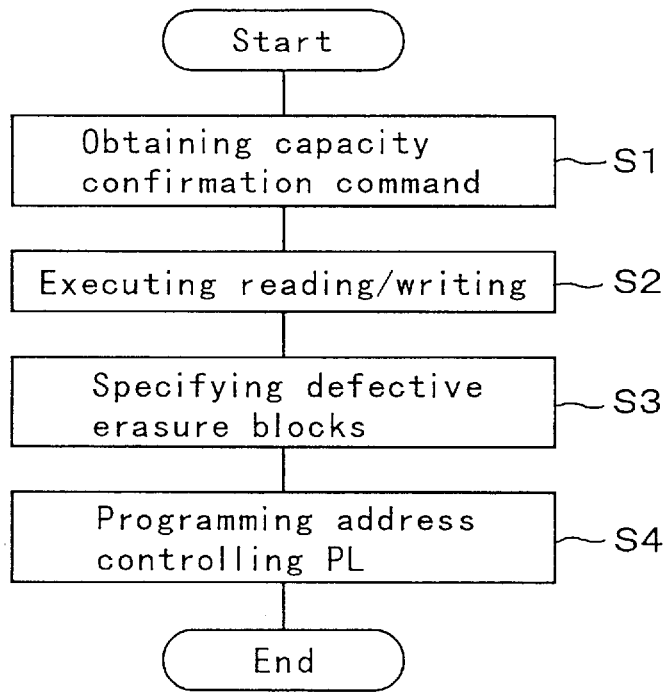
FIG. 2 is a flow chart of an example of the operation for programming an address control PL part 7 in an internal control CPU 3 in FIG. 1.

FIG. 2 is a flow chart showing an example of the operation when the internal control CPU 3 programs the address control PL part 7. The programming operation by the internal control CPU 3 will be described with reference to this FIG. 2. Unless specifically described, every step in the flow chart of FIG. 2 is executed by the internal control CPU 3 and, the operation indicated in FIG. 2 is carried out only when the memory card 1 is put in use for the first time.

In FIG. 2, in the first step S1, the capacity confirmation command to confirm the memory capacity preliminarily registered in the host system apparatus 10 is obtained from the host system apparatus 10. In step S2, data is written/read to the memory part 5. In step S3, erasure blocks having failure areas in the memory part 5 are specified. In step S4, the address control PL part 7 is programmed to make the memory capacity maximum, when the flow is finished.

Next, how the memory capacity of the memory part 5 is maximized through the programming of the address control PL part 7 by the internal control CPU 3 will be depicted in more detail.

Figure 3:
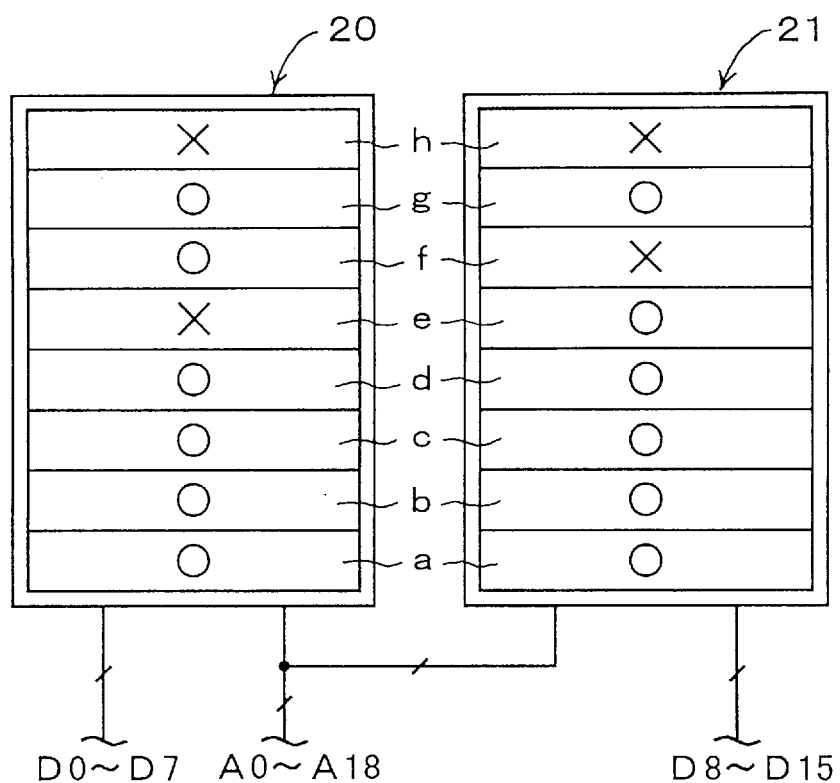
FIG. 3 is a block diagram schematically showing an example of the constitution of erasure blocks of flash memories constituting a memory part 5 in FIG. 1.

FIG. 3 is a block diagram showing schematically an example of the constitution of erasure blocks in the flash memories constituting the memory part 5 of FIG. 1. In FIG. 3, addresses of two flash memories 20, 21 having a data width of 8 bits and erasure blocks of 64 KB each are connected in parallel, so that the data width is made 16 bits. To facilitate understanding, each flash memory 20, 21 in the example is composed of 8 erasure blocks a-h and, only address buses and data buses are indicated in the drawing, while control lines and the like are omitted.

Still referring to FIG. 3, the flash memory 20 has 8 data buses D0–D7 connected thereto, and the flash memory 21 has 8 data buses D8–D15. Moreover, 19 address buses A0–A18 are connected in parallel to the flash memories 20 and 21. At the read/write time, 8-bit data is input/output to/from the flash memory 20 and 8-bit data is output/input from/to the same address of the flash memory 21.

In the map of the flash memories 20 and 21, usable erasure blocks without defective cells are marked with o and erasure blocks with unusable memory cells are marked with x. More specifically, the flash memory 20 has unusable memory cells in the erasure blocks e and h, likewise, the erasure blocks f and h of the flash memory 21 contain unusable memory cells. In this state of FIG. 3, erasure blocks e, f and h in both flash memories 20 and 21 are unusable inferior areas.

An example of the constitution of the address data in the flash memory will be discussed here. The address data includes data for the selection of erasure blocks from the flash memories 20 and 21, and data to be used for selecting cells in the erasure blocks of the flash memories 20 and 21. The address buses A16–A18 and A0–A15 are used to select the erasure blocks and to select cells in the erasure blocks, respectively.

Figure 4:
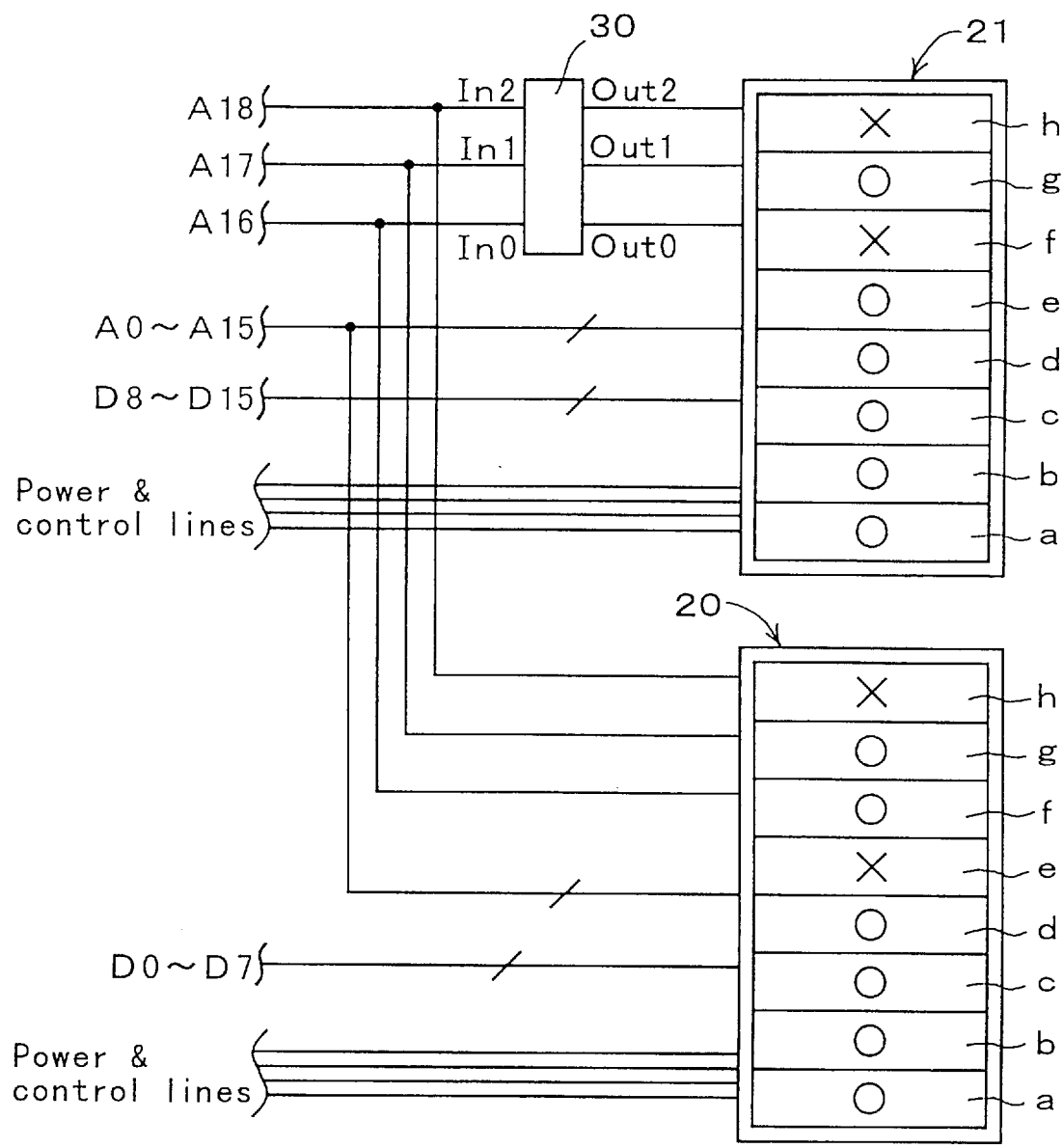
FIG. 4 is a schematic diagram of an example of the connection state of buses in flash memories 20, 21 in FIG. 3.

FIG. 4 is a schematic diagram of an example of the connection state of buses in the flash memories 20, 21 in FIG. 3. In FIG. 4, the flash memory 20 is connected to the address buses A16–A18, data buses D0–D7, a power source and control lines. On the other hand, the flash memory 21 is connected to the data buses D8–D15, power source and control lines, and further connected to the address buses A16–A18 via a PLD 30. The flash memories 20 and 21 are connected parallel to each other via the address buses A0–A15. Meanwhile, the address buses A0–A18, data buses D0–D15 and control lines are connected to the flash memory control circuit 6.

The address bus A16 is connected to an input terminal In0 of PLD 30, the address bus A17 to an input terminal In1 of PLD 30 and the address bus A18 to an input terminal In2 of PLD 30. To the flash memory 21 are input, through an output terminal Out0 of PLD 30, data of the address bus A16, through an output terminal Out1 of PLD data of the address bus A17 and through an output terminal Out2 of PLD data of the address bus A18. The above PLD 30 is a nonvolatile PLD programmed by the internal control CPU 3, constituting the address control PL part 7.

In the thus-constituted flash memories 20 and 21, respective erasure blocks a are selected by data of the address buses of (A18, A17, A16)=(0, 0, 0). In the same manner, respective erasure blocks b are selected when (A18, A17, A16)=(0, 0, 1), blocks c when (A18, A17, A16)=(0, 1, 0), blocks d when (A18, A17, A16)=(0, 1, 1), blocks e when (A18, A17, A16)=(1, 0, 0), blocks f when (A18, A17, A16)=(1, 0, 1), blocks g when (A18, A17, A16)=(1, 1, 0) and blocks h when (A18, A17, A16)=(1, 1, 1).

Under the above condition, when the input and output terminals of PLD 30 get through, that is, signals input to the input terminals In0, In1, In2 of PLD 30 are output from the corresponding output terminals Out0, Out1, Out2, the same data is input through the address buses A16–A18 to the flash memories 20 and 21, so that the erasure blocks a, b, c, d and g in each of the flash memories 20 and 21 can be used parallel.

The internal control CPU 3 preliminarily programs PLD 30 so that PLD 30 outputs the address (1, 0, 0)=(Out2, Out1, Out0) corresponding to the erasure block e when the address (1, 0, 1)=(In2, In1, In0) corresponding to the erasure block f is input to the PLD 30 through the address buses A16–A18. As a result, the address data corresponding to the erasure block e is input through the address buses A16–A18 to the flash memory 21, and the erasure blocks which can be used in parallel in the flash memories 20 and 21 are rendered accordingly a, b, c, d, f and g.

In the manner as described hereinabove, in the memory card according to the embodiment 1 of the present invention, the address buses used to send the address data for the selection of erasure blocks to the memory part 5 are connected to the memory part 5 via the address control PL part 7. The internal control CPU 3 specifies erasure blocks having failure areas in the flash memories of the memory part 5, and programs the address control PL part 7, namely, the nonvolatile PLD 30, so that the address control PL part 7 converts the address data for the selection of the specified erasure blocks in accordance with the program.

Accordingly, every erasure block except the erasure blocks with inferior areas can be used. If the addresses are shared among a plurality of flash memories, useful erasure blocks without inferior areas of the flash memories can be combined to make the memory capacity maximum. The efficiency for the flash memories is thus enhanced and the memory card 1 becomes more cost-efficient.

Embodiment 2

While the nonvolatile PLD is used for the address control PL part 7 in the memory card 1 of the above embodiment 1, a volatile PLD may be used and an embodiment using the volatile PLD will be discussed hereinbelow.

Figure 5:
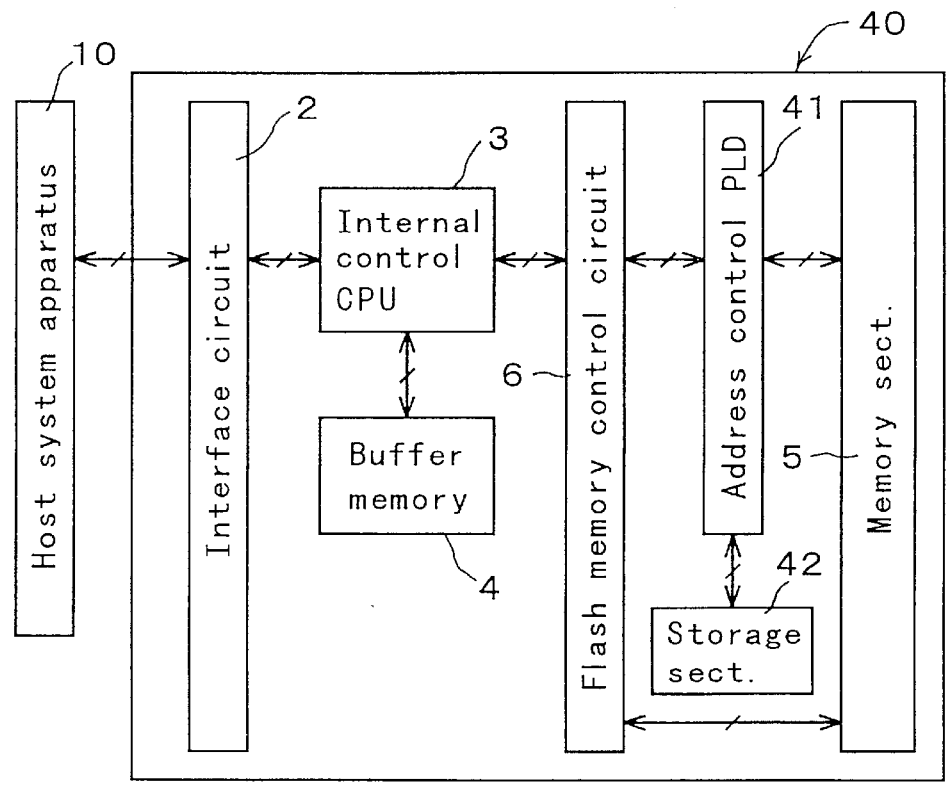
FIG. 5 is a schematic block diagram of an example of a memory card in an embodiment 2 of the present invention.
Figure 6:
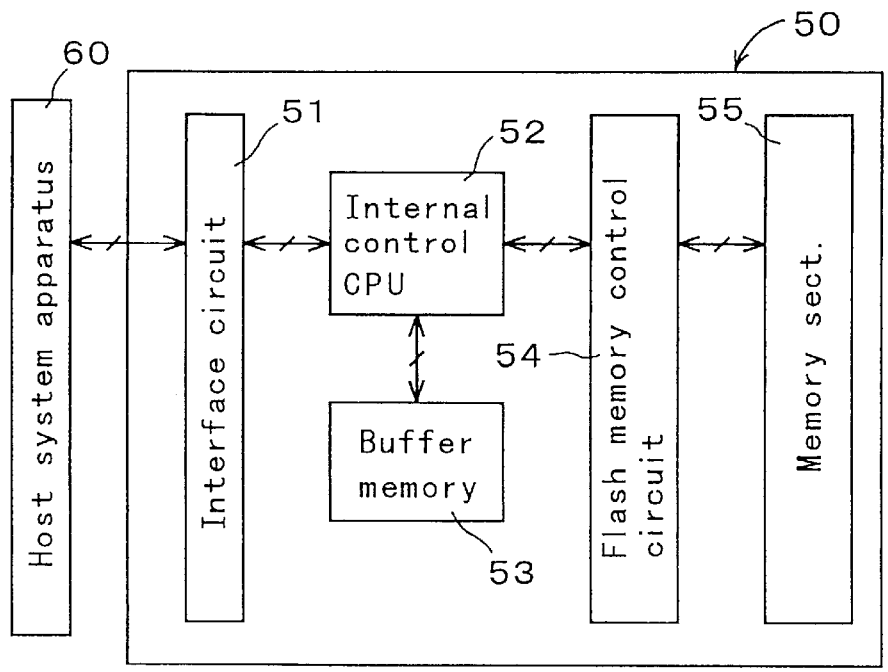
FIG. 6 is a schematic block diagram of an example of a conventional memory card.
Figure 7:
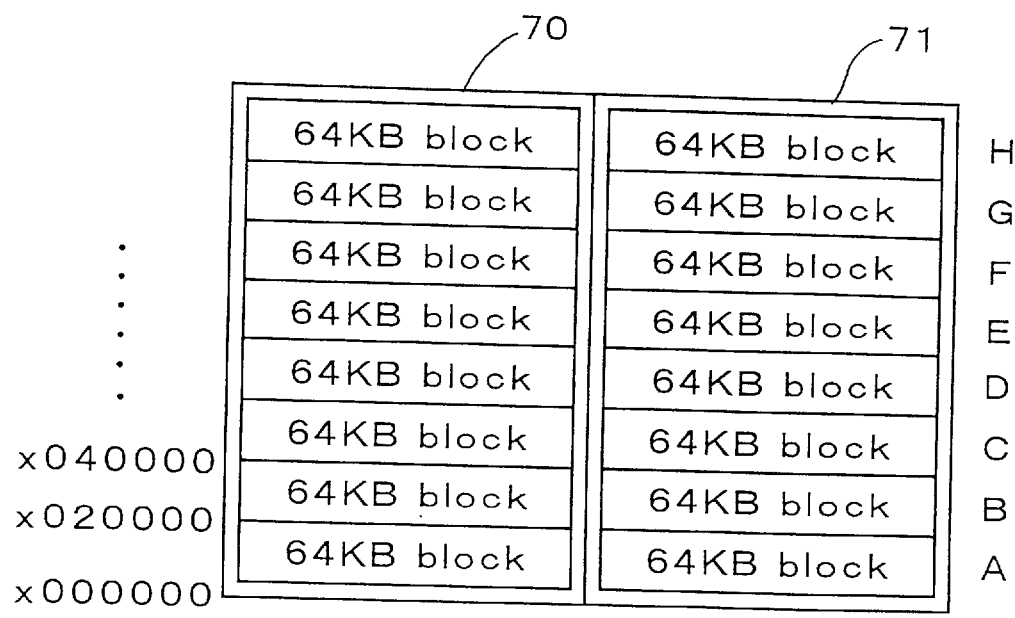
FIG. 7 is a diagram of an example of a memory map of flash memories constituting a memory part 55 in FIG. 6.

FIG. 5 is a block diagram schematically showing the constitution of an example of a memory card according to an embodiment 2 of the present invention, in which the same parts are designated by the same reference numerals as in FIG. 1. Differences from FIG. 1 will be described below, with the description of the same parts being omitted.

FIG. 5 is different from FIG. 1 in that the address control PL part 7 of FIG. 1 is formed of a volatile PLD. Moreover, a storing part is added to store contents of the program made to the address control PL part 7 by the internal control CPU 3 when the memory card is used for the first time. Thus, the address control PL part 7 in FIG. 1 is changed to an address control PL part 41 and the memory card 1 of FIG. 1 becomes a memory card 40 with the storing part 42.

The memory card 40 in FIG. 5 consists of the interface circuit 2 for inputting/outputting data to an external data processor to be connected to the memory card 40, the internal control CPU 3 for controlling signals in the memory card 40, the buffer memory 4 for inputting/outputting of data, the memory part 5 including of flash memories, the flash memory control circuit 6 for controlling the memory part 5 in accordance with control data from the internal control CPU 3, the address control PL part 41 formed of the volatile PLD, and the storing part 42, e.g., a serial EEPROM for storing contents of the program for the PLD of the address control PL part 41. In the memory card 40 constituted as above, the flash memory control circuit 6 is connected to the memory part 5 via the address control PL part 41 and the storing part 42 is connected to the address control PL part 41.

The address control PL part 41 works the same as the address control PL part 7 in FIG. 1. The sole difference is that the address control PL part 41 is formed of the volatile PLD. When the power is supplied to the memory card 40, the volatile PLD automatically reads and sets contents of the program stored in the storing part 42. The address control PL part 41 operates in the same fashion as the address control PL part 7 except the above point. The address control PL part 41 and the storing part 42 constitute the address conversion part.

When the address control PL part 41 is programmed by the internal control CPU 3, the process is carried out in accordance with the flow chart shown in FIG. 2, except that in step S4, the address control PL part 41, not the part 7, is programmed to make the memory capacity maximum and the program contents are stored in the storing part 42. The detailed description of the process is hence omitted here. After the process is executed when the memory card 40 is used for the first time, every time the power supply to the memory card 40 is started, the PLD of the address control PL part 41 automatically reads out the program stored in the storing part 42 and automatically sets itself in accordance with the program. The erasure blocks of the flash memories constituting the memory part 5 are in the same constitution as schematically indicated in FIG. 3, and also the connection state of buses in each flash memory of the memory part 5 is the same as in FIG. 4 except that the PLD 30 is replaced with a volatile PLD 45, the description of which will be omitted.

In the memory card according to the embodiment 2 of the present invention as described hereinabove, the address buses used for sending address data for the selection of erasure blocks in the memory part 5 are connected to the memory part 5 via the address control PL part 41 and the erasure blocks having inferior areas in the memory part 5 are specified by the internal control CPU 3 to program the address control PL part 41 including the volatile PLD 45. The program is stored in the storing part 42. Every time the electricity is initially supplied to the memory card 40, the volatile PLD 45 automatically reads the program stored in the storing part 42 and automatically sets itself in accordance with the program, thereby converting the address data for selecting the erasure blocks. Accordingly, the same effect as by the memory card of the embodiment 1 is achieved.

As is made clear from the foregoing description of the memory card of the present invention, the control part programs the address conversion part to convert the address data for the selection of predetermined erasure blocks to address data for selecting other erasure blocks. That is, the control part obtains a predetermined command registered beforehand from the host equipment, performs writing/reading to the memory part in accordance with the command thereby specifying unusable erasure blocks in the memory part, and converts the address data for the selection of the unusable erasure blocks to address data for selecting the other usable erasure blocks. The control part programs the address conversion part in the manner above. If a plurality of nonvolatile memories of the memory part share addresses, the usable erasure blocks can be used in combination. The efficiency for the memories is enhanced when the erasure blocks are combined to make the memory capacity maximum. The cost of the memory card is thereby reduced.

Moreover, the address conversion part uses the nonvolatile PLD or, the nonvolatile storing part for storing the program and the volatile PLD which reads out the program stored in the storing part thereby to convert/set the address data every time the power supply is initiated. Therefore, the address conversion part is capable of storing the programmed content even if the power supply to the memory card is shut off. Since it is enough for the control part to program the address conversion part once at the first operation time, usable erasure blocks can be combined at all times afterwards when the addresses are shared among a plurality of nonvolatile memories in the memory part. The efficiency for memories is enhanced by combining the erasure blocks to make the memory capacity maximum and at the same time, the cost of the memory card is reduced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A memory card with block-erasure type nonvolatile memory units, comprising:
    an interface means for connecting said memory card to said host apparatus;
    a memory means having a plurality of nonvolatile block-erasure type memory units which are accessed in parallel so that an address is shared between an erasure block of a first memory unit and an erasure block of a second memory unit;
    a control means for inputting/outputting data to/from said host apparatus via said interface means and managing memory and address data to said memory means; and
    an address conversion means which converts address data output from said control means to select respective erasure blocks in the memory units of said memory means in accordance with a program,
    wherein, when an address received from said control means corresponds to a valid erasure block of said first memory unit but a defective erasure block of said second memory unit, said address conversion means converts the address which is being sent to said second memory unit so that valid erasure blocks of said first and second memory units are accessed in parallel.

2. A memory card according to claim 1, wherein said control means specifies unusable erasure blocks in said memory means and controls said address conversion means so that the address data for selecting the unusable erasure blocks is converted to address data for selecting useable erasure blocks.

3. A memory card according to claim 2, wherein said control means obtains a pre-registered, predetermined command from said host apparatus, and writes/reads data to/from said memory means in accordance with the command, thereby specifying unusable erasure blocks in said memory means.

4. A memory card according to claim 2, wherein said programmable address conversion means holds and stores programmed contents from said control means even when the power supply to the memory card is shut off.

5. A memory card according to claim 2, wherein said address conversion means is formed of a nonvolatile programmable logic device.

6. A memory card according to claim 2, wherein said address conversion means includes a volatile programmable logic device (PLD) and a data storing means having at least one nonvolatile memory which stores said program, and said volatile PLD reads out said program from said storing means each time the power supply to the memory card is initiated, thereby converting/setting address data.

7. A method for reading/writing data from/to a memory card having an internal controller, an address converter, and first and second block-erasure type memory units which are accessed in parallel so that a single address is used to access an erasure block of a first memory unit and an erasure block of a second memory unit, comprising:
    pre-storing an indication of defective erasure block locations of the first and second memory units of the memory card;
    inputting/outputting data from/to a host apparatus via an interface which connects said memory card to the host apparatus;

transferring an address from the internal controller to the address converter of the memory card; and determining whether the address transferred from the internal controller is to be converted to a new address, wherein, when an address transferred from the internal controller to the address converter corresponds to a valid erasure block of the first memory unit but a defective erasure block of the second memory unit, the address converter converts the address which is sent to the second memory unit so that valid erasure blocks of the first and second memory units are accessed in parallel.

8. The method according to claim 7, wherein said pre-storing step includes;

receiving a preliminary command from the host apparatus, writing/reading data to/from the first and second memory units in accordance with the preliminary command, and specifying defective erasure blocks in the first and second memory units based on said writing/reading step.

9. The method according to claim 7, wherein the address converter is a nonvolatile programmable logic device.

10. The method according to claim 7, wherein the address converter includes a volatile programmable logic device (PLD) and a nonvolatile storage device which stores address conversion program data, the volatile PLD reading the address conversion program data from the nonvolatile storage device each time power supply to the memory card is initiated.

* * * * *